(12) United States Patent
Pezeshki

(10) Patent No.: US 7,573,928 B1
(45) Date of Patent: Aug. 11, 2009

(54) SEMICONDUCTOR DISTRIBUTED FEEDBACK (DFB) LASER ARRAY WITH INTEGRATED ATTENUATOR

(75) Inventor: Bardia Pezeshki, Redwood City, CA (US)

(73) Assignee: Santur Corporation, Fremont, CA (US)

( * ) Notice: Subject to any disclaimer, the term of this patent is extended or adjusted under 35 U.S.C. 154(b) by 363 days.

(21) Appl. No.: 10/935,408

(22) Filed: Sep. 7, 2004

Related U.S. Application Data

(60) Provisional application No. 60/500,389, filed on Sep. 5, 2003.

(51) Int. Cl.
*H01S 5/00* (2006.01)
(52) U.S. Cl. .................. 372/50.11; 372/43.01
(58) Field of Classification Search ............. 372/50.12, 372/23, 20, 50.11, 50.1
See application file for complete search history.

(56) References Cited

U.S. PATENT DOCUMENTS

| | | | |
|---|---|---|---|
| 4,009,385 A | 2/1977 | Sell | |
| 4,359,773 A | 11/1982 | Swartz et al. | |
| 4,498,730 A | 2/1985 | Tanaka et al. | |
| 4,558,449 A * | 12/1985 | Gordon | 372/44.01 |
| 4,725,131 A | 2/1988 | Goodwin et al. | |
| 4,796,266 A | 1/1989 | Banwell et al. | |
| 4,815,087 A | 3/1989 | Hayashi | |
| 4,920,542 A * | 4/1990 | Brosson et al. | 372/50.12 |
| 5,002,349 A | 3/1991 | Cheung et al. | |
| 5,136,598 A | 8/1992 | Weller et al. | |
| 5,191,590 A * | 3/1993 | Kuindersma et al. | 372/50.1 |
| 5,222,071 A * | 6/1993 | Pezeshki et al. | 372/26 |
| 5,228,050 A | 7/1993 | LaCourse et al. | |
| 5,265,111 A * | 11/1993 | Chesnoy et al. | 372/32 |
| 5,383,216 A | 1/1995 | Takemi | |
| 5,412,675 A | 5/1995 | Odagawa | |
| 5,515,196 A | 5/1996 | Kitajima et al. | |
| 5,561,682 A | 10/1996 | Aoki et al. | |
| 5,590,145 A * | 12/1996 | Nitta | 372/50.22 |
| 5,612,968 A | 3/1997 | Zah | |
| 5,691,999 A * | 11/1997 | Ball et al. | 372/20 |
| 5,706,117 A | 1/1998 | Imai et al. | |
| 5,784,183 A | 7/1998 | Aoki et al. | |
| 5,953,359 A | 9/1999 | Yamaguchi et al. | |
| 5,978,402 A | 11/1999 | Matsumoto et al. | |
| 5,987,044 A | 11/1999 | Odagawa et al. | |

(Continued)

OTHER PUBLICATIONS

Li, et al., "16-Wave Length Gain-Coupled DFB Laser Array with Fine Tunability", IEEE Photonics Technology Letters, Jan. 1996, vol. 8, No. 1, pp. 22-24.

(Continued)

*Primary Examiner*—Armando Rodriguez
*Assistant Examiner*—Tuan N. Nguyen
(74) *Attorney, Agent, or Firm*—Klein, O'Neill & Singh, LLP

(57) ABSTRACT

A semiconductor laser with an integrated attenuator on the same chip as the laser. In some embodiments the attenuator is formed of the same material as the laser, but without a grating in the attenuator. In some embodiments the laser and attenuator are fabricated concurrently, with the attenuator positioned at the front of the laser and differing from the laser only in not having a grating and having a much smaller length. Level of attenuation by the attenuator is adjustable based on drawing photogenerated current from the attenuator.

13 Claims, 8 Drawing Sheets

U.S. PATENT DOCUMENTS

| | | | |
|---|---|---|---|
| 6,031,860 A * | 2/2000 | Nitta et al. | 372/50.11 |
| 6,150,667 A | 11/2000 | Ishizaka et al. | |
| 6,275,317 B1 | 8/2001 | Doerr et al. | |
| 6,295,308 B1 | 9/2001 | Zah | |
| 6,411,424 B1 | 6/2002 | Raj | |
| 6,516,017 B1 | 2/2003 | Matsumoto | |
| 6,522,793 B1 | 2/2003 | Szilagyi et al. | |
| 6,650,675 B2 * | 11/2003 | Sahara et al. | 372/50.11 |
| 6,658,035 B1 | 12/2003 | Mason et al. | |
| 6,687,278 B1 | 2/2004 | Mason et al. | |
| 6,693,926 B2 | 2/2004 | Cayrefourcq et al. | |

OTHER PUBLICATIONS

Kudo et al., "Multiwavelength Microarray Semiconductor Lasers", Electronics Letters, Oct. 15, 1998, vol. 34, No. 21, pp. 2037-2039.

Liu et al., "Cost-Effective Wavelength Selectable Light Source Using DFB Fibre Laser Array", Electronics Letters, Mar. 30, 2000, vol. 36, No. 7, pp. 620-622.

Pezeshki et al., "12nm Tunable WDM Source Using an Integrated Laser Array", Electronics Letters, Apr. 27, 2000, vol. 36, No. 9, pp. 788-789.

* cited by examiner

SEMICONDUCTOR DISTRIBUTED FEEDBACK (DFB) LASER ARRAY WITH INTEGRATED ATTENUATOR

CROSS-REFERENCE TO RELATED APPLICATION

This application claims the benefit of the filing date of U.S. Provisional Patent Application No. 60/500,389, filed Sep. 5, 2003, the disclosure of which is incorporated by reference herein.

BACKGROUND OF THE INVENTION

This invention relates generally to optical devices, and more particularly to semiconductor laser devices.

Semiconductor lasers are used for generating light that carries data in fiber-optic systems. A common form of laser for long distance fiber optic communication is a distributed feedback (DFB) laser. In a DFB a diffraction grating is embedded in the laser and controls the wavelength. These devices can be made single mode and have narrow linewidths and excellent low noise characteristics appropriate for fiber optic applications.

Frequently, the intensity level from DFB lasers may require adjustment. This can occur for many reasons. For example, in wavelength division multiplexed (WDM) links, where light of many different wavelengths is traveling through a fiber simultaneously, one may need to adjust the optical power in each wavelength very carefully since erbium-doped fiber optic amplifiers used in fiber optic transmission systems tend to amplify stronger signals more than weaker signals. Typically, the maximum attenuation levels that may be required are between 3 and 10 dB. Unfortunately, merely decreasing the optical power exiting a DFB laser by reducing the current injected into the laser may affect optical properties of light exiting the laser. For instance, as the current is reduced in DFB lasers, the side-mode-suppression-ratio (SMSR) decreases, the linewidth gets worse, and the relaxation oscillation frequency moves to lower frequencies and increases the relative intensity noise (RIN).

Thus variable optical attenuators (VOAs) are useful and realized in many different embodiments. These include LiNbO modulators, liquid crystal devices, MEMs based mechanical shutters or mirrors, and thermo-optically activated glass waveguides. However, all these devices are separate optical components that are packaged either by splicing on to fibers, or by carefully aligning to the free space optical beam. This increases the cost and the complexity of the device.

One can also use a semiconductor optical amplifier (SOA) to adjust output power, and these devices can be integrated with the laser itself. In this case the SOA region is pumped quite hard to amplify the light of the laser. The light intensity can then be adjusted by controlling the current injected into the SOA. Unfortunately, the SOA, like any amplifier, also adds spontaneous emission noise to the light and degrades the optical signal. Amplifier regions are generally quite long, usually between 200 microns to 1 mm, and operate at high current levels of 150 mA to 500 mA.

Another device or alternative is an electro-absorption modulator (EAM). The structure is similar to the SOA, except that it is operated in reverse bias and the bandgap of the EAM is adjusted to be above the lasing energy, such that the device is transparent under normal conditions. As the device is reverse biased, the bandgap decreases due to Franz-Keldysh or Quantum Confined Stark Effect and the material becomes absorbing, reducing the power transmitted from the device. Generally these devices are used at high frequencies to encode the data on the optical signal and operated from zero volts to 2-3 volts reverse bias. Though the devices are usually quite short (<200 microns in length), the on-state loss is relatively high at 1-3 dB, and the fabrication is complicated since the bandgap is varied from the active region of the laser to the modulator region of the EAM.

SUMMARY OF THE INVENTION

Apparatuses and methods to integrate an attenuator region with a laser. In one aspect the invention provides a semiconductor based optoelectronic device, comprising a semiconductor laser section and a semiconductor attenuator section integrated on the same chip; the semiconductor laser section comprised of active material having a predefined bandgap; the semiconductor attenuator section receiving light generated by the laser section and comprised of active material having the nominally same predefined bandgap as the active material of the semiconductor laser section; circuitry coupled to the semiconductor attenuator section, the circuitry configured to collect photocurrent generated in the semiconductor attenuator section and thereby attenuate light by the semiconductor attenuator section.

In another aspect the invention provides a method of attenuating light from a laser, comprising biasing a semiconductor laser on a chip to cause the semiconductor laser to emit light; providing the light to a semiconductor attenuator on the chip, the semiconductor attenuator having bandgap properties similar to bandgap properties of the semiconductor laser; reverse biasing the semiconductor attenuator, thereby drawing photocurrent from the semiconductor attenuator.

In another aspect the invention provides a method of variably attenuating light from a laser, comprising providing current to a semiconductor laser on a chip, thereby causing the semiconductor laser to emit light; drawing current from a semiconductor attenuator on the chip, the magnitude of the current drawn from the semiconductor attenuator opposite in sign from the current provided to the semiconductor laser; monitoring light emitted from the chip; and varying the magnitude of the current drawn from the semiconductor attenuator based on the monitoring of light emitted from the chip.

In one embodiment, a second section is added to the laser and the absorption characteristics of this section is varied to attenuate the power that passes from the laser through this section. This section contains active material with no grating, and is formed as a continuation of the laser waveguide. The bandgap of the material is the same as that of the laser, and at low optical intensities, the material is strongly absorbent. However, as the input intensity increases, the absorption is quickly saturated and the section becomes largely transparent, with an insertion loss generally less than 1 dB. The reason is that the light creates transitions from the valence band to the conduction band. Once there are no more carriers left to make the transition, absorption is reduced. Since this occurs in a p-n junction with a built-in electric field, the carriers are separated into the n and p regions and under open circuit conditions a voltage is generated that prevents further carrier separation. The high carrier density leads to low optical absorption.

The absorption can be increased by providing an external return path for the carriers. For example, by externally shorting out the p and n regions of the diode, photocurrent flows through this external path and the carrier density in the active material drops. The material thus becomes much more absorbing. In some embodiments, the external path is off chip (not included with the same chip as the laser and the attenuator region). In some embodiments the external path is separate, or not contained, in the laser and the attenuator region.

In some embodiments, the external path is a circuit coupled to the attenuator to draw current from the attenuator region. The circuit may include a fixed or variable inductor, resistor, transistor or the like that can draw current from the attenuator region to prevent the attenuator section from saturating.

Unlike an electro-absorption modulator, the bandgap of the attenuator section is the same as the laser and no complex electro-optic effects are needed. Unlike an SOA, the diode is not strongly forward biased to change the gain in the material. Varying the amount of photocurrent that flows through the external circuit modulates the absorption. The absorption of the attenuator is power dependent, and the photocurrent subtracts optical power from the beam.

In some embodiments, an array of such attenuators is fabricated at the output of a laser array. The attenuating devices are all be shorted together and controlled with a single contact, in further embodiments. Device operation can be improved somewhat, particularly when an array geometry is used by applying a small forward bias to help obtain transparency, and a reverse bias to collect the photogenerated carriers.

For example, an integrated optoelectronic chip where the output power can be controlled without degrading other optical characteristics comprises a laser section that generates light and contains gratings for providing feedback, an attenuator section that contains active material (such as quantum wells) but no gratings, and external means of adjusting the attenuator to reduce the power exiting the device.

In some embodiments the active material in the attenuator has the same composition as the active material in the laser. The external means collects photocurrent from the integrated optoelectronic chip, increased current leading to increased attenuation. The multiple lasers and multiple attenuators may be fabricated on the same chip and multiple attenuators may be connected together and accessed with a single contact pad.

The output power of an integrated optoelectronic chip can be controlled without degrading other optical characteristics. Such an integrated optoelectronic chip may comprise a laser section that generates light and contains gratings for providing feedback, an attenuator section that contains active material (such as quantum wells) but no gratings, external means of adjusting the attenuator to reduce the power exiting the device.

In one embodiment, the active material in the attenuator has the same composition as the active material in the laser and an external means collects photocurrent from the device, increased current leading to increased attenuation. In another embodiment, multiple lasers and multiple attenuators are fabricated on the same chip. The multiple attenuators are connected together and accessed with a single contact pad.

In the VOA the material becomes transparent largely because of generated photocurrent. By routing this photocurrent externally, the saturation level is raised and the material becomes more absorbing.

In some embodiments an integrated VOA is provided at the rear of a DFB laser. In phase shifted DFBs, power exits the front of the laser and also the back of the laser. The back of the laser is often anti-reflection coated in order to eliminate any reflections into the laser from the back facet. An undesired reflection from the back facet can add a phase shift to the lasing condition and make the laser go into multiple modes. However, large amounts of light exiting the back of the laser is also undesirable, since the light can scatter in the package and cause errors on photodetectors used for power monitoring and wavelength locking. A VOA section, where the contact is simply grounded or put at a constant reverse bias at the rear of the chip causes the light exiting the back of the back to be absorbed. Thus there is no reflected light into the laser cavity that can cause errors in phase, and neither is there any transmitted light from the rear that can scatter in the package.

DETAILED DESCRIPTION

In one embodiment, a DFB laser containing gain material and a grating for feedback is integrated with a semiconductor attenuator region with an active material but no grating layer. The light from the DFB laser passes through the attenuator region. The attenuator region acts to absorb light and generates a photocurrent. If a contact to the attenuator is left open, the optical energy saturates the gain material, rendering it transparent, and the majority of the light entering from the DFB laser is transmitted out of the attenuator region. On the other hand, if the generated photocurrent is allowed to flow out of the attenuator region, the photo-generated carriers do not build up and the material continues to absorb light. Thus by adjusting the bias conditions to the attenuator region, the light intensity exiting the device can be controlled. In some embodiments, an array of lasers and attenuators is fabricated, where each laser is individually contacted, but all the attenuators are shorted together with a single contact. The power out of any laser from the array can thus be adjusted by appropriately biasing the attenuator contact.

Figure 1:
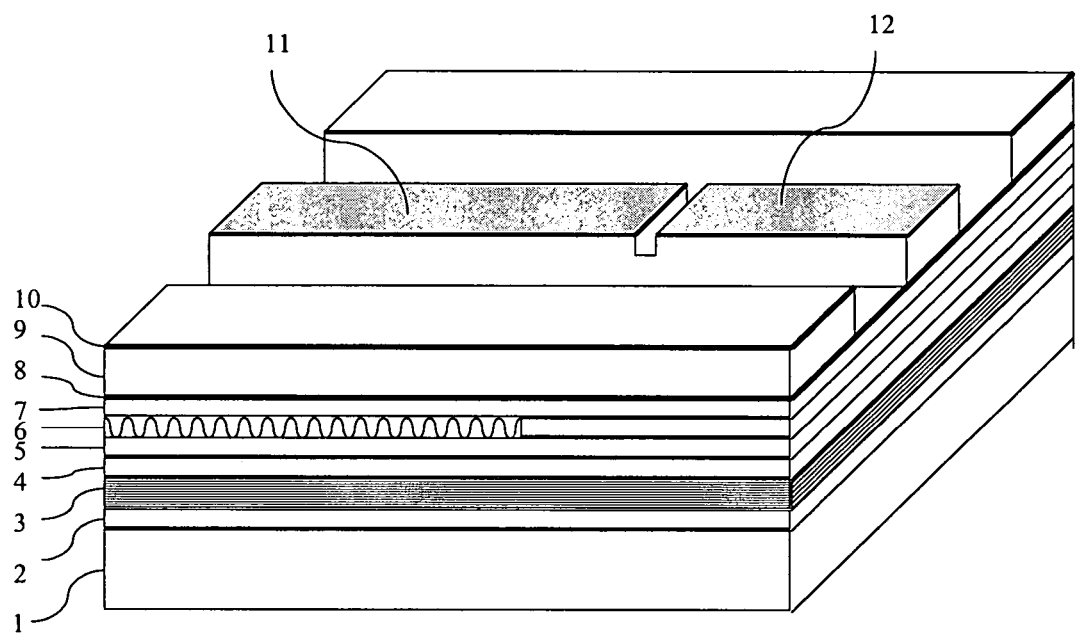
FIG. 1 illustrates a laser with attenuator in accordance with aspects of the invention.

FIG. 1 illustrates an embodiment of a single chip laser with attenuator. The chip includes a laser section 11 and an attenuator section 12. As is clear from the following, in the chip of FIG. 1 the laser section and the attenuator section are formed of the same material. The two sections differ, however, in that the laser section includes a grating, while the attenuator section does not include a grating. More particularly, in the device of FIG. 3, active material of both the laser section and the attenuator section have the same bandgap.

As shown in FIG. 1, structurally, in some embodiments, on an n-doped InP wafer 1, a waveguide containing quantum wells for gain are grown followed by a grating layer. The waveguide starts with 60 nm layer of InGaAsP 2, lattice matched to InP with a bandgap such that the room temperature PL is at 1100 nm. Then six quantum wells 3 are grown, each quantum well consisting of InGaAsP with a bandgap of 1550 nm and each barrier consisting of InGaAsP with a bandgap of 1150 nm. The quantum wells are under compressive stress of about 1%, while the barriers are under tensile strength of about 1%. The quantum well width is 8 nm while the barrier width is about 10 nm.

The waveguide continues with a top InGaAsP layer 4 that is identical or similar to layer 2. The waveguide and quantum wells are undoped, in one embodiment. After the waveguide, a p-doped InP 5 is grown with a thickness of 300 nm. There follows a 30 nm thick p-doped grating layer 6 of InGaAsP with a bandgap of 1150 nm. The growth is interrupted and gratings are formed on the laser section 11 of the chip. Electron beam lithography may be used to pattern the grating, with a phase shift of one quarter of a wave in the center to assure single mode operation. The pitch of the grating for 1550 nm operation is approximately 240 nm. The wafer is then wet etched and placed back in the MOCVD reactor for regrowth.

FIG. 1 shows a single DFB laser and attenuator combination. For an array of 12 lasers with different wavelengths, twelve gratings are patterned with different pitches. Either case, there is no grating formed in the attenuator section.

In the second regrowth, a 300 nm p-type InP spacer 7 is grown at an appropriate temperature to preserve the grating. There follows an InGaAsp (PL=1150 nm) etch stop layer 8 with a thickness of 20 nm, then a 2 micron thick top p-type InP cladding 9. In one embodiment, all the p-doped layers up to this point are doped with zinc, at a concentration of $3 \times 10 f/cm^3$. To enable electrical contact to the device, a top 100 nm thick InGaAs layer 10 finishes the growth with a high zinc doping of $1 \times 10^{19}/cm^3$.

For a single DFB laser and attenuator combination, a single ridge is etched into the material, stopping at the etch-stop layer. This ridge waveguide is further patterned and partially etched between the laser 11 and the attenuator section 12. The laser length is 750 microns, while the modulator section is approximately 50 microns. The stripe width for both the laser and the modulator is about 3.5 microns. The wafer up to this point is shown in FIG. 1. Subsequently, 100 nm of SiO2 is applied to the wafer, windows opened lithographically is applied above the laser and attenuator sections, and separate p-metallization is applied to the two sections. The metal is then plated to lower the resistance. The wafer is thinned, cleaved, and both the front and the back facets of the device are anti-reflection coated.

In operation, light exits the laser section and enters the attenuator section, with the amount of light passing through the attenuator section varying as discussed herein. Light from the laser section passes through the attenuator section, where the light is attenuated. In some embodiments the light passed through the attenuator section is thereafter provided to an optical fiber or other component of, for example, a dense wave division multiplex (DWDM) communication system. Thus the attenuator may be considered to be located at the front of the laser, with the front of the laser providing light for transmission in an optical communication system. In other embodiments the attenuator section is at the rear of the laser, and attenuates, or absorbs, light exiting the rear of the laser.

Figure 2:
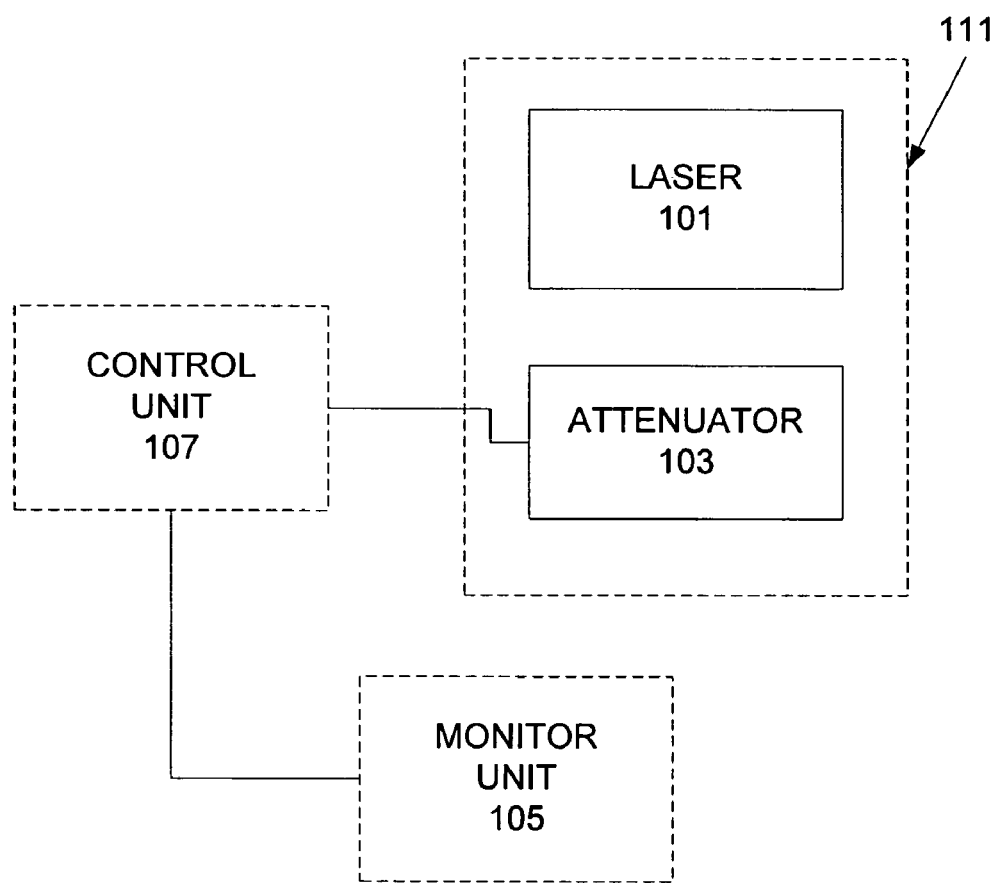
FIG. 2 is a block diagram of a system with a single chip laser/attenuator in accordance with aspects of the invention.

A simplified block diagram of one embodiment of a laser 101 coupled to an attenuator region 103 is shown in FIG. 2. The laser 101 and the attenuator region 103 are fabricated on or as one chip 111, in one embodiment. The absorption characteristics of the attenuator region is varied to attenuate the power that passes from the laser through the attenuator section.

In one embodiment, the absorption characteristics of the attenuator region is varied by a control unit 107 and a monitor unit 105. The monitor unit detects the output power exiting the attenuator region. If the output power exceeds a threshold, e.g., indicating that the attenuator region is saturated, control unit 107 draws current from the attenuator region. Otherwise, the control unit 107 does not or reduces draw of current from the attenuator region. In one embodiment, the control unit is an inductor, resistor, transistor or the like that is coupled to the attenuator region or otherwise activated to draw current from the attenuator region when so indicated by the monitor unit. Likewise, the control unit is de-coupled from the attenuator section or otherwise de-activated, e.g., to prevent or reduce current draw from the attenuator region, as indicated by the monitor unit. The control unit, in one embodiment, is also configured to draw current at a specific or variable rate. The rate or activation of the control unit may be monitored and regulated by a controller, such as a processor, acting on information generated by the monitor unit The monitor unit, in one embodiment, is a photodetector or another type of device measuring the output power exiting the attenuator region, and may be downstream a fiber receiving the output light. In another embodiment, a monitor unit may be positioned after the attenuator region. Multiple monitor units may also be positioned in any combination of positions relative to the attenuator region.

Figure 3:
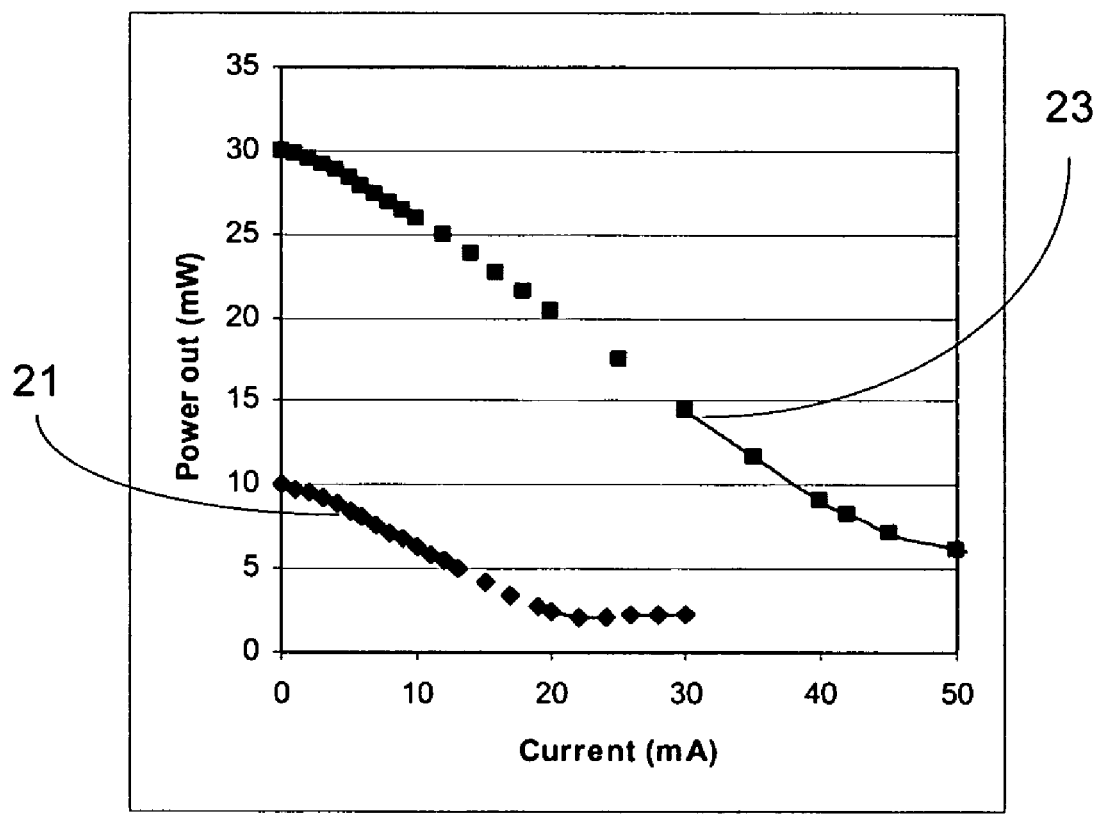
FIG. 3 is a graph showing relationships between output power and attenuation current under two different laser drive conditions for a device in accordance with aspects of the invention.

In FIG. 3, measured characteristics of an exemplary VOA are shown. In this example, twelve lasers are integrated together with attenuator sections on or coupled to the output. The current generated by the attenuator is controlled and routed to ground. As the photocurrent is collected, the light output decreases. The two lines 21 and 23 in FIG. 3 correspond to different drive conditions for a DFB. In line 21, the DFB is operated such that 30 mW output power is obtained with the attenuator contact left open. In the second case, shown by line 23, the DFB is operated at a lower current to provide 10 mW. The x-axis current is the photocurrent diverted from the attenuator. Since the wavelength of operation is 1.55 microns, with a photon energy of about 0.8 meV, we would expect the power to drop by about 0.8 mW for every mA of photocurrent. In fact, the slope is about 0.6 due to leakage and uncontrolled optical absorption in the device. The slope of the lines gets less close to the 0 mA axis because in a twelve element device current generated by the attenuator coupled to an active laser is partially diverted to other diodes. There is also recombination in the diode itself, with the recombination rate increasing with carrier density.

That the photocurrent subtracts from the power is similar to what is observed in vertical cavity electroabsorption devices, as described by D. A. B. Miller in "The quantum well self-electrooptic effect device: optical bistability and oscillation, and self-linearized modulation," IEEE Journal of Quantum Electronics, vol QE-21, (9), 1985, pp. 1462-1475, the disclosure of which is incorporated by reference. Specifically the behavior is shown in FIG. 14 of the reference.

The fabrication of a DFB laser array with attenuators on the output may be straightforward and similar to the fabrication of a DFB with an SOA. Such devices, e.g., the attenuator, may be made much shorter than an SOA and used to attenuate and not amplify.

Figure 4:
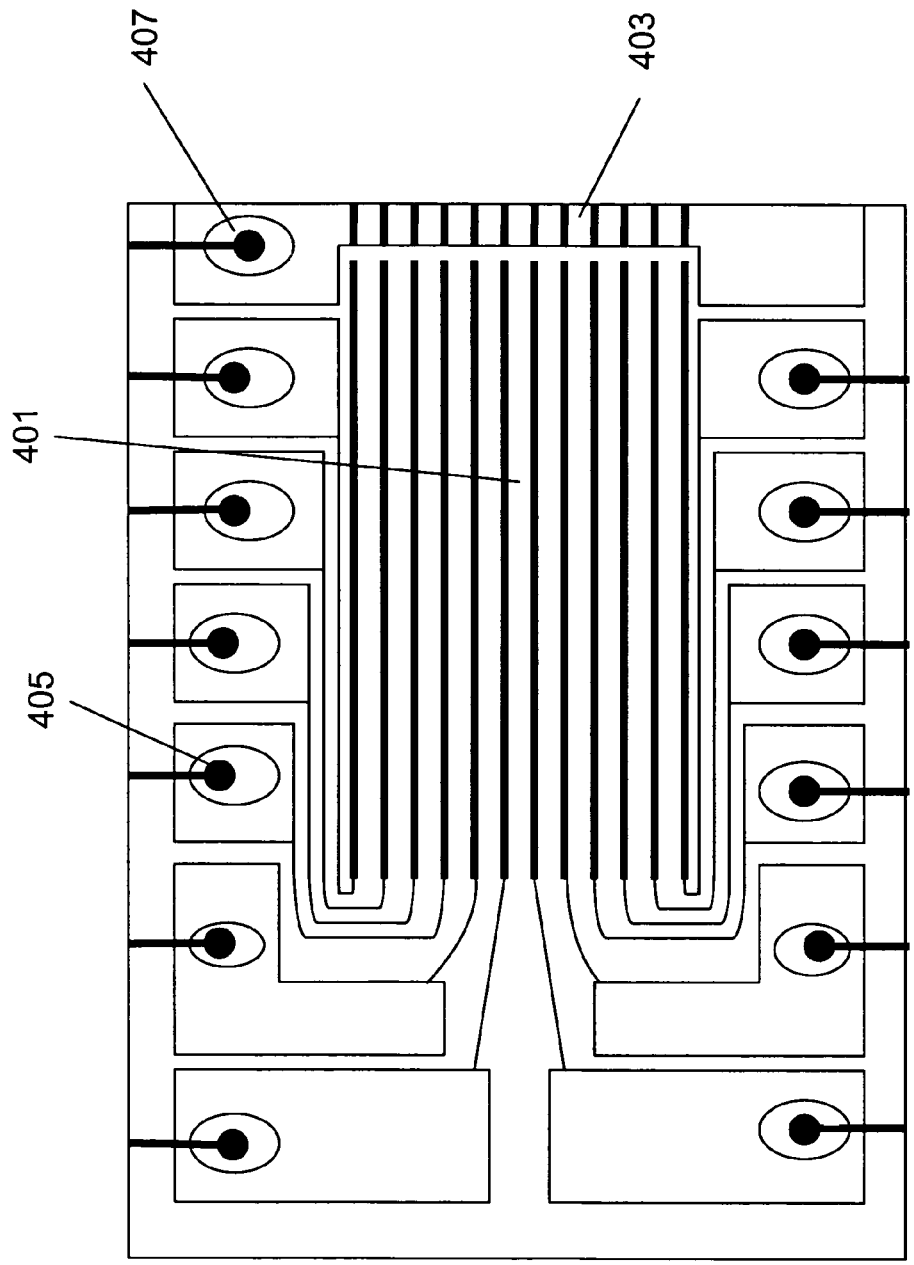
FIG. 4 is a top view of a chip with an array of lasers and variable optical attenuator in accordance with aspects of the invention.

For an array device, in one embodiment, the process is similar as described with respect to FIG. 1, except that multiple stripes are etched into the material, and the top metallization is patterned such that the lasers can each be individually contacted, while the attenuators are connected through a common metal pad. FIG. 4 shows a top view of a completed chip. The chip includes twelve laser stripes 401. Twelve VOAs 403 are approximate the front of the laser stripes, with a corresponding VOA for each laser stripe. Each laser stripe has separate contact, e.g., contact 405. A common contact 407 is provided from the VOAs. The VOA section is at the right of the chip with a 30 micron length, while the cavity length of the DFB lasers is 750 microns.

Figure 5:
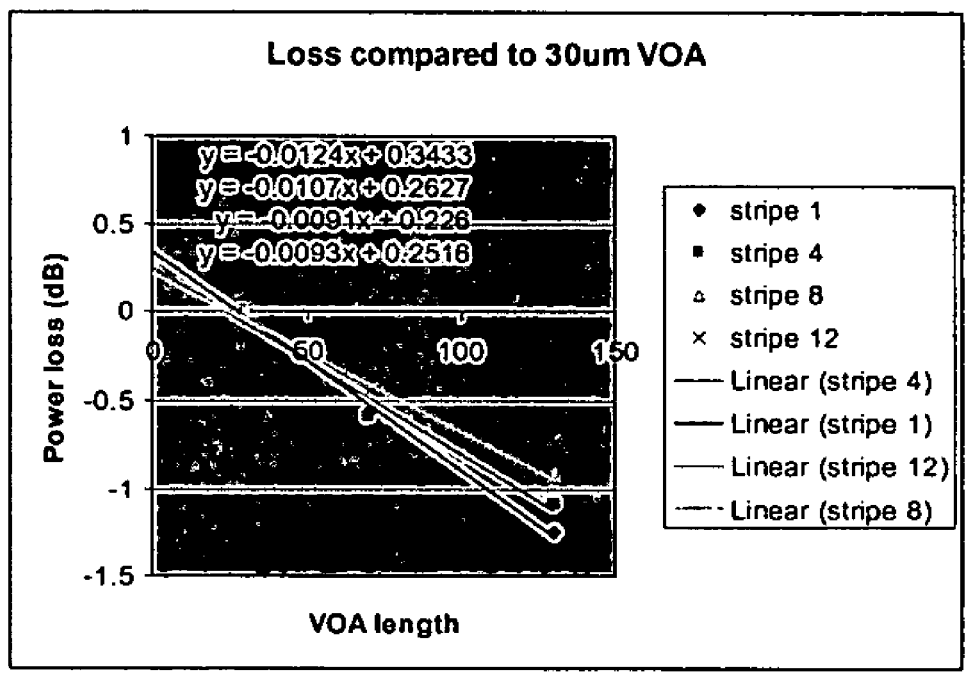
FIG. 5 is a graph showing relationships between power loss and VOA length for devices in accordance with aspects of the invention.

The appropriate length of the VOA can be obtained experimentally and will vary given the active material in the laser. In one example, three different length devices, like the device shown in FIG. 4, are fabricated. The insertion loss and the maximum attenuation are then measured. The open circuit optical power of the devices are compared and the results shown in FIG. 5, along with a linear fit. As the length of the device increases, the open circuit loss increases. Since each stripe has a different wavelength, the slope of the line changes with different stripe numbers with about 1 dB/100 microns of length.

Similarly, the maximum attenuation can also be measured as a function of length. Using a similar approach, the value for the device material seems to be about 1 dB/10 microns. Thus an attenuator can be fabricated with a length of 100 microns. It can yield about 10 dB contrast, while having an insertion loss of only 1 dB.

Figure 6:
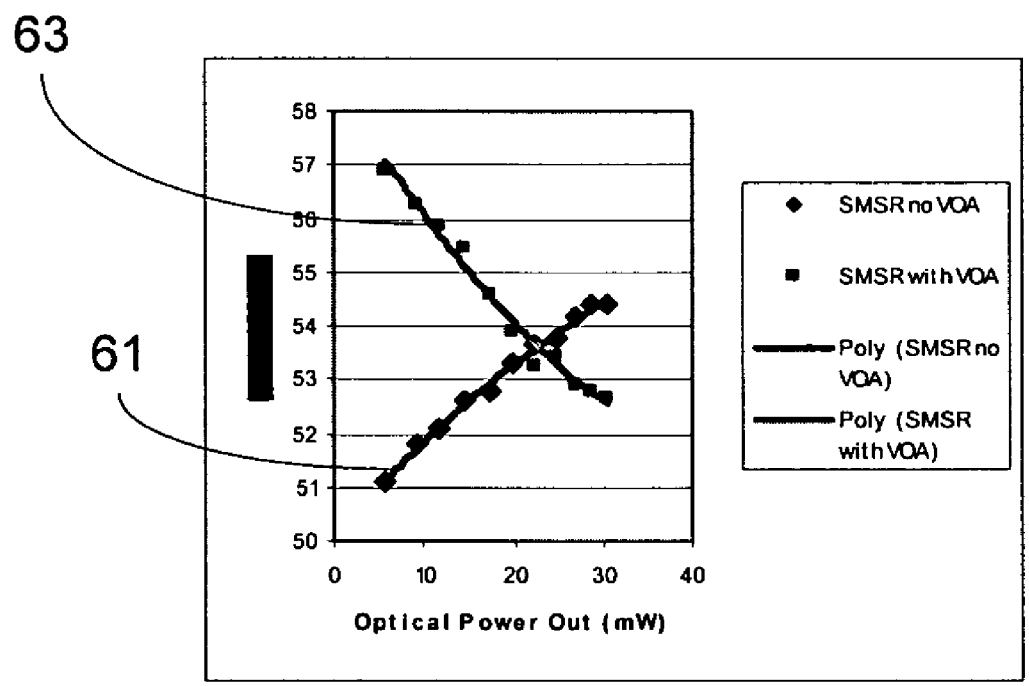
FIG. 6 is a graph showing relationships between side mode suppression ratio (SMSR) and output power for devices in accordance with aspects of the invention.

As mentioned previously, using an attenuator to lower the output power does not degrade the optical quality of the signal. This is indicated, for example, in FIG. 6, where the side mode suppression ratio is plotted as a function of output power. The dark line 61 represents the side mode suppression ratio (SMSR) when the power is adjusted by varying the drive current to the laser, while the lighter line 63 represents the case when the laser current is constant and only the VOA is adjusted. In the case of where the current is adjusted, the SMSR is worse at low output powers and improves as the output power increases. On the other hand, using the VOA improves the SMSR at low output power levels, which may be due to the output facet of the VOA being not perfectly anti-reflection coated. As the attenuation is increased, the effective reflectivity into the laser is decreased, enhancing the performance of the laser.

Figure 7:
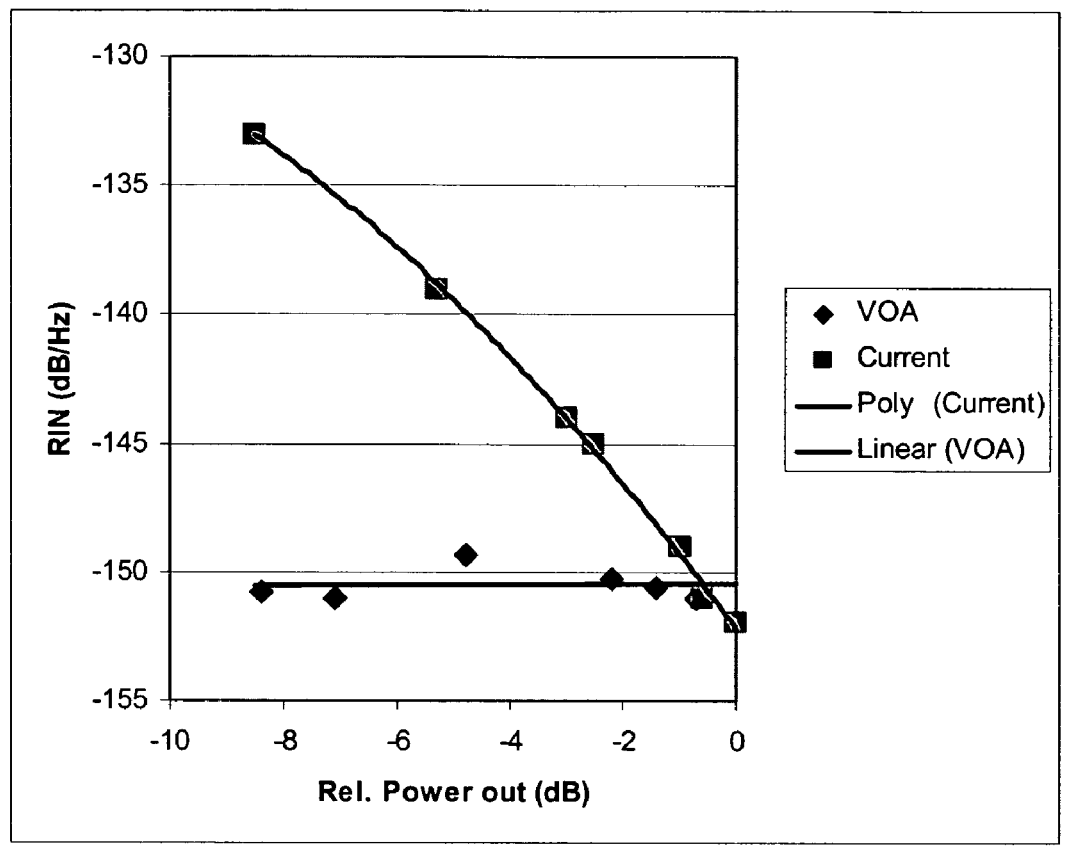
FIG. 7 is a graph showing relationship between relative intensity noise (RIN) and output power for devices in accordance with aspects of the invention.

The same enhancement is true with relative intensity noise (RIN). For example, FIG. 7, the measured RIN up to 10 GHz of a laser with an integrated attenuator when the power is adjusted in two different ways is shown. In one case, the power is varied by controlling the current to the laser, while the attenuator section is left open circuited. The current is varied between 75 mA to 300 mA to adjust the power by a relative 9 dB. The RIN is found to vary between −133 dB/Hz at low power levels to about −152 dB/Hz at high power levels. In another case, the laser current remains fixed at 300 mA, while the attenuator section is biased between zero to 70 mA. Once again, the power varies by about 9 dB. However, the RIN does not change from its lowest value.

An attenuator can also be extremely useful in reducing the light coming out of the rear of a phase shifted DFB that is anti-reflection coated on both ends. An anti-reflection coating on the rear facet is useful so that there is no parasitic reflection back into the lasing cavity that would reduce the side mode suppression ratio or make the laser operate multi-mode. However, a rear anti-reflection coated facet allows a substantial amount of light to exit the laser. Such unwanted light coming from the rear of the laser could scatter in the package and cause undesirable effects. For example, the scattered light may confuse control loops for power monitoring or locking the wavelength, or potentially even be reflected from the package back into the laser. An absorbing region at the rear of the laser reduces the power of light emitted from the rear of the laser without causing reflections into the lasing cavity.

Figure 8:
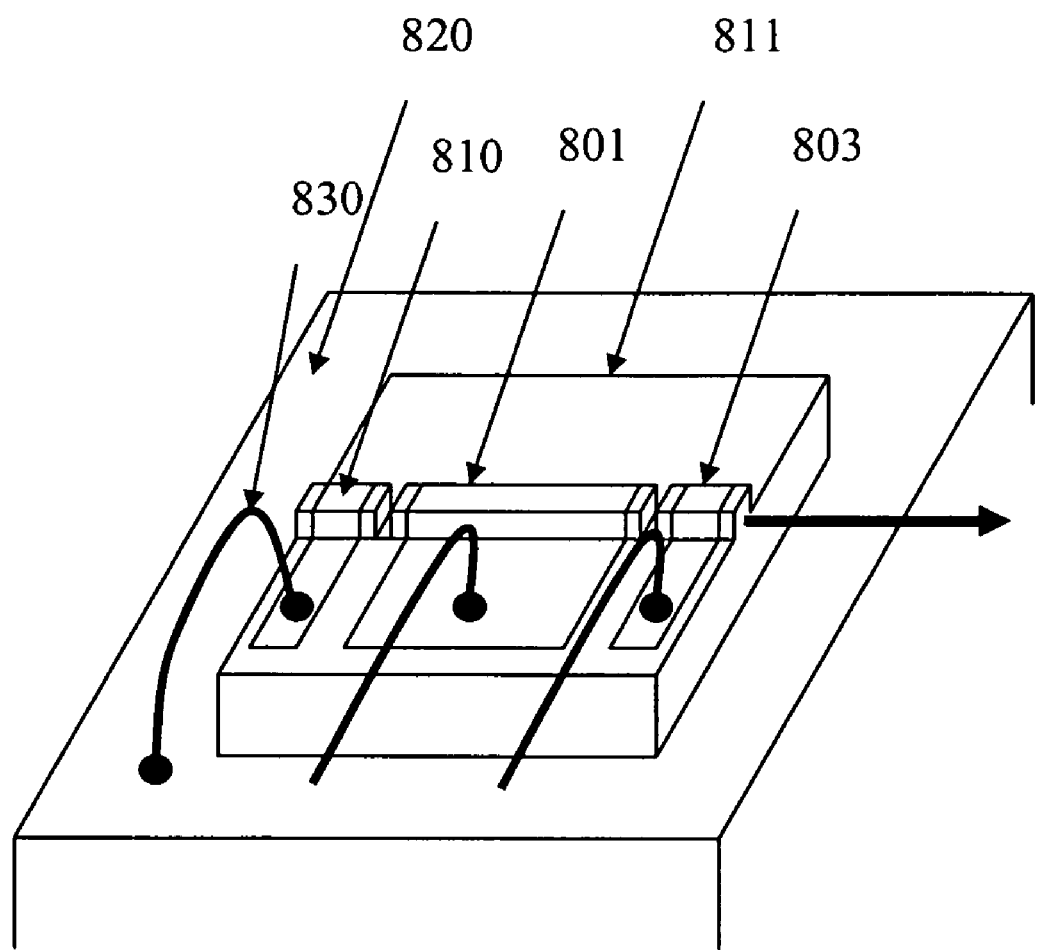
FIG. 8 illustrates a laser with attenuator and with absorber in accordance with aspects of the invention.

Such a device is shown in FIG. 8. A chip 811 is mounted to a substrate. The chip includes a laser 801. A drive wire is bonded to a contact pad 804 coupled to an anode of the laser. The wire allows for provision of a drive current to the laser, which causes the laser to emit light. The laser has a front edge from which light intended for use is emitted. A VOA 803 is approximate the first edge of the laser and positioned to receive light emitted from the front edge of the laser. The VOA is fabricated as part of the same chip as the laser, and includes active material having the same bandgap material as the laser. A wire for an attenuation signal is bonded to a contact pad 805 coupled to the VOA. The wire allows for removal of photogenerated current from the VOA. In operation, current is provided on the drive wire, for example by application of a bias voltage above the voltage at the laser cathode (not shown). The current causes the laser to emit light from the front edge of the laser, with the light entering the VOA. The light enters the VOA, which absorbs the light at levels based on carrier densities in the VOA. Current is drawn from the VOA to provide desired absorption, or attenuation, of the light emitted from the front of the laser.

In addition, an absorber 810 is positioned at the rear edge of the laser. The absorber, like the VOA, is fabricated as part of the same chip as the laser. The absorber is structurally, in terms of material, the same as the VOA. The absorber is shorted directly to ground 820 with a wirebond 830. Alternatively, one may etch the laser and make the electrical contact within the laser, thus obviating the need for a wirebond. Greater absorption can be obtained by connecting the rear absorber to a negative voltage rather than simply to zero volts with respect to the cathode. In terms of structure and function, the rear absorber is identical to the front VOA.

Although the present invention has been described with respect to certain embodiments, those of skill in the art would recognize insubstantially different variations thereof. Accordingly, the present invention should be viewed as the claims supported by this disclosure and insubstantial variations thereof.

What is claimed is:

1. A semiconductor based optoelectronic device, comprising:
    a semiconductor laser section and a semiconductor attenuator section integrated on the same chip;
    the semiconductor laser section comprised of active material having a predefined bandgap;
    the semiconductor attenuator section positioned to receive light generated by the laser section and comprised of active material having nominally the same predefined bandgap as the active material of the semiconductor laser section;
    circuitry coupled to the semiconductor attenuator section, the circuitry configured to collect photocurrent generated in the semiconductor attenuator section and thereby attenuate light by the semiconductor attenuator section;
    wherein the laser section and attenuator section each comprise:
        a waveguide; and
        a grating layer; and
        wherein the grating layer of the laser section includes a grating and the grating layer of the attenuator section does not include a grating;
    wherein the laser section and the attenuator section each have a length, and the length of the laser section is much greater than the length of the attenuator section; and
    wherein the length of the laser section is approximately 15 times greater than the length of the attenuator section.

2. A semiconductor based optoelectronic device, comprising:
- a semiconductor laser section and a semiconductor attenuator section integrated on the same chip;
- the semiconductor laser section comprised of active material having a predefined bandgap;
- the semiconductor attenuator section positioned to receive light generated by the laser section and comprised of active material having nominally the same predefined bandgap as the active material of the semiconductor laser section;
- circuitry coupled to the semiconductor attenuator section, the circuitry configured to collect photocurrent generated in the semiconductor attenuator section and thereby attenuate light by the semiconductor attenuator section; and
- wherein the laser has a front and a rear, and the attenuator section is positioned approximate the front of the laser, and further comprising a semiconductor absorbing section position approximate the rear of the laser, the semiconductor absorbing section comprised of active material having nominally the same predefined bandgap as the active material of the semiconductor laser section.

3. A semiconductor based optoelectronic device, comprising:
- a semiconductor laser section and a semiconductor attenuator section integrated on the same chip;
- the semiconductor laser section comprised of active material having a predefined bandgap;
- the semiconductor attenuator section positioned to receive light generated by the laser section and comprised of active material having nominally the same predefined bandgap as the active material of the semiconductor laser section;
- circuitry coupled to the semiconductor attenuator section, the circuitry configured to collect photocurrent generated in the semiconductor attenuator section and thereby attenuate light by the semiconductor attenuator section;
- at least one further laser section and at least one further attenuator section to comprise a plurality of semiconductor laser sections and a plurality of semiconductor attenuator sections integrated on the same chip;
- each of the semiconductor laser sections comprised of active material having a predefined bandgap;
- each of the semiconductor attenuator sections receiving light generated by a corresponding laser section and comprised of active material having nominally the same predefined bandgap as the active material of the corresponding laser section;
- circuitry coupled to the at least one further attenuator section, the circuitry configured to collect photocurrent generated in the semiconductor attenuator section and thereby attenuate light by the at least one further attenuator section; and
- wherein each laser has a front and rear, and each corresponding attenuator section is positioned approximate the front of each corresponding laser, and further comprising semiconductor absorbing sections, a corresponding semiconductor absorbing section positioned approximate the rear of each laser, each semiconductor absorbing section comprised of active material having nominally the same predefined bandgap as the active material of the corresponding semiconductor laser section.

4. A semiconductor based optoelectronic device, comprising:
- a semiconductor laser section and a semiconductor attenuator section integrated on the same chip;
- the semiconductor laser section comprised of active material having a predefined bandgap;
- the semiconductor attenuator section positioned to receive light generated by the laser section and comprised of active material having nominally the same predefined bandgap as the active material of the semiconductor laser section;
- circuitry coupled to the semiconductor attenuator section, the circuitry configured to collect photocurrent generated in the semiconductor attenuator section and thereby attenuate light by the semiconductor attenuator section;
- a monitor unit for detecting an indication of power of light emitted from the attenuator section;
- wherein the circuitry comprises a control unit configured to draw current from the attenuator section based on the indication of power of light emitted from the attenuator section; and
- at least one further monitor unit to comprise a plurality of monitor units, each of the monitor units detecting an indication of power of light emitted from any position relative the attenuator section;
- wherein the circuitry comprises a control unit configured to draw current from the attenuator section based on the indication of power of light detected by the at least one further monitor unit.

5. The semiconductor based optoelectronic device of claim 4 wherein the at least one further monitor unit comprises a photodetector.

6. A semiconductor based optoelectronic device, comprising:
- a semiconductor laser section and a semiconductor attenuator section integrated on the same chip;
- the semiconductor laser section comprised of active material having a predefined bandgap;
- the semiconductor attenuator section positioned to receive light generated by the laser section and comprised of active material having nominally the same composition as the active material of the semiconductor laser section;
- circuitry coupled to the semiconductor attenuator section, the circuitry configured to collect photocurrent generated in the semiconductor attenuator section and thereby attenuate light by the semiconductor attenuator section;
- wherein the laser section and the attenuator section each comprise:
  - a waveguide; and
  - a grating layer; and
  - wherein the grating layer of the laser section includes a grating and the grating layer of the attenuator section does not include a grating;
- wherein the laser section and the attenuator section each have a length, and the length of the laser section is much greater than the length of the attenuator section; and
- wherein the length of the laser section is approximately 15 times greater than the length of the attenuator section.

7. A semiconductor based optoelectronic device, comprising:
- a semiconductor laser section and a semiconductor attenuator section integrated on the same chip;
- the semiconductor laser section comprised of active material having a predefined bandgap;
- the semiconductor attenuator section positioned to receive light generated by the laser section and comprised of active material having nominally the same composition as the active material of the semiconductor laser section;

circuitry coupled to the semiconductor attenuator section, the circuitry configured to collect photocurrent generated in the semiconductor attenuator section and thereby attenuate light by the semiconductor attenuator section;

wherein the laser has a front and a rear, and the attenuator section is positioned approximate the front of the laser, and further comprising a semiconductor absorbing section position approximate the rear of the laser, the semiconductor absorbing section comprised of active material having nominally the same composition as the active material of the semiconductor laser section.

8. A semiconductor based optoelectronic device, comprising:

a semiconductor laser section and a semiconductor attenuator section integrated on the same chip;

the semiconductor laser section comprised of active material having a predefined bandgap;

the semiconductor attenuator section positioned to receive light generated by the laser section and comprised of active material having nominally the same composition as the active material of the semiconductor laser section;

circuitry coupled to the semiconductor attenuator section, the circuitry configured to collect photocurrent generated in the semiconductor attenuator section and thereby attenuate light by the semiconductor attenuator section;

at least one further laser section and at least one further attenuator section to comprise a plurality of semiconductor laser sections and a plurality of semiconductor attenuator seconds integrated on the same chip;

each of the semiconductor laser sections comprised of active material having a predefined bandgap;

each of the semiconductor attenuator sections receiving light generated by a corresponding laser section and comprised of active material having nominally the same composition as the active material of the corresponding laser section; and circuitry coupled to the at least one further attenuator section, the circuitry configured to collect photocurrent generated in the semiconductor attenuator section and thereby attenuate light by the at least one further attenuator section.

9. The semiconductor optoelectronic device of claim 8 wherein the semiconductor attenuator sections are electrically coupled.

10. The semiconductor optoelectronic device of claim 9 wherein the circuitry coupled to the semiconductor attenuator section and the circuitry coupled to the at least one further attenuator section is the same circuitry and is coupled to a contact pad electrically coupled to all of the semiconductor attenuator sections.

11. The semiconductor optoelectronic device of claim 8 wherein each laser has a front and a rear, the front being in the direction in which light is transmitted from the semiconductor based optoelectronic device, and each corresponding attenuator section is positioned approximate the front of each corresponding laser.

12. The semiconductor optoelectronic device of claim 8 wherein each laser has a front and rear, the front being in the direction in which light is transmitted from the semiconductor based optoelectronic device, and each corresponding attenuator section is positioned approximate the rear of each corresponding laser.

13. The semiconductor optoelectronic device of claim 8 wherein each laser has a front and rear, and each corresponding attenuator section is positioned approximate the front of each corresponding laser, and further comprising semiconductor absorbing section, a corresponding semiconductor absorbing section positioned approximate the rear of each laser, each semiconductor absorbing section comprised of active material having nominally the same composition as the active material of the corresponding semiconductor laser section.

* * * * *

UNITED STATES PATENT AND TRADEMARK OFFICE
CERTIFICATE OF CORRECTION

| | |
|---|---|
| PATENT NO. | : 7,573,928 B1 |
| APPLICATION NO. | : 10/935408 |
| DATED | : August 11, 2009 |
| INVENTOR(S) | : Bardia Pezeshki |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this

Fourteenth Day of December, 2010

David J. Kappos
*Director of the United States Patent and Trademark Office*